United States Patent
Lee

(10) Patent No.: US 8,119,512 B1
(45) Date of Patent: Feb. 21, 2012

(54) METHOD FOR FABRICATING SEMICONDUCTOR DEVICE WITH DAMASCENE BIT LINE

(75) Inventor: Chang-Goo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/980,902

(22) Filed: Dec. 29, 2010

(30) Foreign Application Priority Data

Dec. 9, 2010 (KR) .......... 10-2010-0125516

(51) Int. Cl.
*H01L 21/44* (2006.01)

(52) U.S. Cl. ......... 438/597; 257/E21.537; 257/E21.579; 257/E21.627; 257/E21.641; 257/E21.657; 257/E21.658; 438/672; 438/675

(58) Field of Classification Search ........... 257/E21.537, 257/E21.579, E21.627, E21.641, E21.657, 257/E21.658; 438/597, 672.675
See application file for complete search history.

(56) References Cited

U.S. PATENT DOCUMENTS

| 6,861,313 B2 * | 3/2005 | Song | 438/253 |
| 2011/0070716 A1 * | 3/2011 | Kim | 438/386 |

FOREIGN PATENT DOCUMENTS

KR 2003002749 * 1/2003

* cited by examiner

*Primary Examiner* — Asok Sarkar
(74) *Attorney, Agent, or Firm* — IP & T Group LLP

(57) ABSTRACT

A method for fabricating a semiconductor device includes forming an interlayer dielectric layer over a substrate; forming a dual storage node contact plug to be buried in the interlayer dielectric layer, forming a first damascene pattern to isolate the dual storage node contact plug, forming a protective layer pattern inside the first damascene pattern, etching the interlayer dielectric layer to form a second damascene pattern to be coupled to the first damascene pattern, and forming bit lines inside the first and second damascene patterns.

20 Claims, 7 Drawing Sheets

METHOD FOR FABRICATING SEMICONDUCTOR DEVICE WITH DAMASCENE BIT LINE

CROSS-REFERENCE TO RELATED APPLICATIONS

The present application claims priority of Korean Patent Application No. 10-2010-0125516, filed on Dec. 9, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with a damascene bit line.

As the integration degree of memory devices is increasing, formation of a self-aligned contact process for a storage node contact plug after forming a bit line contact plug and a bit line is becoming more difficult. In sub-30 nm memory devices, open space of a storage node contact hole has been difficult to secure and a self-aligned contact fail (SAC fail) occurs frequently due to decreases in process margins.

In order to address such features, a damascene bit line process is used in which a storage node contact plug is first formed and a bit line is subsequently formed.

The damascene bit line process is performed as follows.

First, a dual storage node contact hole is formed in which two adjacent storage node contact plugs are formed simultaneously. More specifically, a storage node contact plug is first formed to be buried in the dual storage node contact hole. Through a damascene process, the storage node contact plug is separated. A bit line is formed to fill a damascene pattern.

In the damascene bit line process, patterning may be easily performed in comparison with when storage node contact plugs are individually formed. Furthermore, self-aligned contact fail occur less frequently compared with a process in which storage node contact plugs are formed later. Furthermore, when the storage node contact plugs are first formed and bit lines are later formed, a short circuit between the storage node contact plug and a word line and a short circuit between the storage node contact plug and the bit line may be prevented.

FIG. 1 is a photograph illustrating a conventional method for forming a damascene bit line.

Referring to FIG. 1, when a damascene pattern is formed, a dual storage node contact plug is etched (see 12), and an interlayer dielectric layer is simultaneously etched (see 11). For example, the interlayer dielectric layer is first etched to open a first damascene pattern 11, and the dual storage node contact plug is subsequently etched to open a second damascene pattern 12. Therefore, the first and second damascene patterns 11 and 12 are coupled to form a line shape, and a bit line is subsequently formed in the damascene patterns.

In the conventional method, however, when the dual storage node contact plug is etched, the first damascene pattern 11 is additionally etched. Here, the bottom of the first damascene pattern 11 is damaged (see B). Accordingly, the etching process of the first damascene pattern 11 may not be sufficiently performed. Since the etching process is not sufficiently performed, the bottom profile of the first damascene pattern 11 may be sloped, and a bottom open critical dimension (CD) may not be secured.

In order to prevent the first damascene pattern 11 from causing damages, the etching amount of the second damascene pattern 12 may be reduced and thus, the storage node contact plug may not be easily separated (see A).

SUMMARY OF THE INVENTION

An embodiment of the present invention is directed to a method for fabricating a semiconductor device, which is capable of isolating a dual storage node contact plug during a damascene process and simultaneously securing the bottom profile of a damascene pattern and a bottom open CD.

In accordance with an embodiment of the present invention, a method for fabricating a semiconductor device includes: forming an interlayer dielectric layer over a substrate; forming a dual storage node contact plug to be buried in the interlayer dielectric layer; forming a first damascene pattern to isolate the dual storage node contact plug; forming a protective layer pattern inside the first damascene pattern; etching the interlayer dielectric layer to form a second damascene pattern to be coupled to the first damascene pattern; and forming bit lines inside the first and second damascene patterns.

In accordance with another embodiment of the present invention, a method for fabricating a semiconductor device includes: forming a plurality of active regions in a substrate, the active regions being isolated by an isolation layer; forming an interlayer dielectric layer over the substrate; etching the interlayer dielectric layer to form a dual storage node contact hole which simultaneously opens adjacent ones of the active regions; forming a dual storage node contact plug to be buried in the dual storage node contact hole; forming a first damascene pattern to isolate the dual storage node contact plug into independent storage node contact plugs; forming a protective layer pattern inside the first damascene pattern; etching the interlayer dielectric layer to form a second damascene pattern to be coupled to the first damascene pattern; and forming bit lines inside the first and second damascene pattern.

DESCRIPTION OF SPECIFIC EMBODIMENTS

Figure 1:
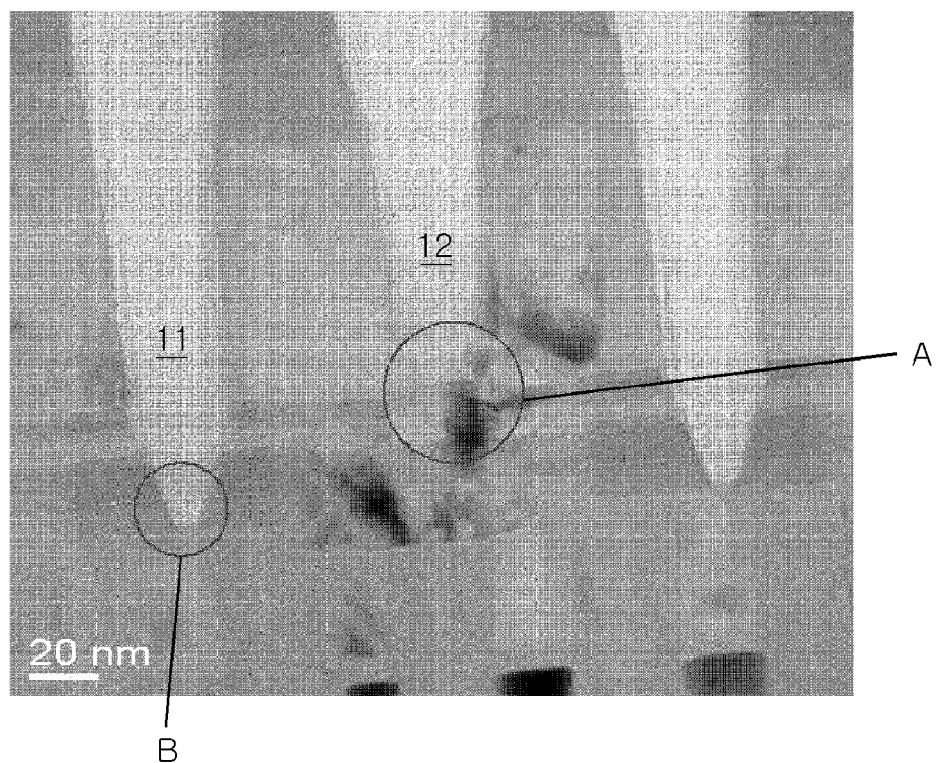
FIG. 1 is a photograph illustrating a conventional method for forming a damascene bit line.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
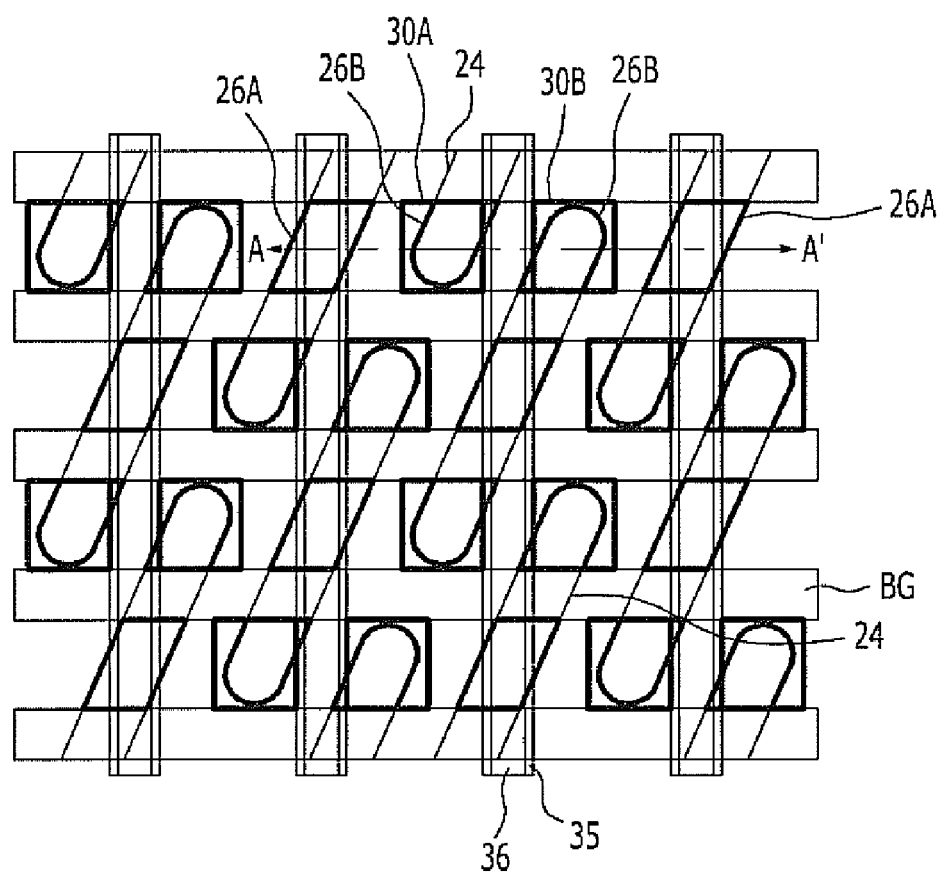
FIG. 2 is a plan view of a semiconductor device in accordance with an embodiment of the present invention.

FIG. 2 is a plan view of a semiconductor device in accordance with an embodiment of the present invention.

Referring to FIG. 2, buried gates BG are formed in active regions 24. The buried gates BG are formed by partially filling trenches 24 formed in the active regions 24. The buried gates BG may be formed according to a well-known method. On the active regions 24 excluding buried gates BG, first landing plugs 26A and second landing plugs 26B are formed. Storage node contact plugs 30A and 30B are formed on the second landing plugs 26B. The storage node contact plugs 30A and 30B are isolated by a damascene bit line 36. The storage node contact plugs 30A and 30B are formed when a dual storage node contact plug are isolated by a damascene pattern. Reference numeral of the damascene pattern is omitted in FIG. 2. As will be described below, the damascene bit line 36 is formed inside the damascene pattern. The first landing plug 26A is coupled to the damascene bit line 36. A spacer 35 is formed on both sidewalls of the damascene bit line 36.

FIGS. 3A to 3I are cross-sectional views illustrating a method for fabricating a semiconductor device in accordance with an embodiment of the present invention taken along line A-A' of FIG. 2.

Figure 3A:
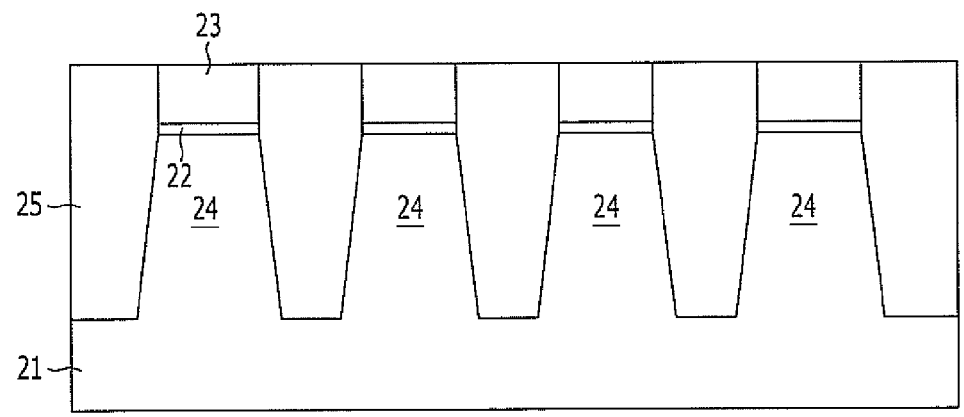
FIGS. 3A to 3I are cross-sectional views illustrating a method for fabricating a semiconductor device in accordance with an embodiment of the present invention, taken along line A-N of FIG. 2.

Referring to FIG. 3A, an isolation layer 25 is formed in a semiconductor substrate 21. The isolation layer 25 is formed by using a well-known shallow trench isolation (STI) process. For example, the semiconductor substrate 21 is etched by using a pad oxide layer 22 and a pad nitride layer 23 as an etch barrier in order to form an isolation trench, and an insulation layer is buried in the isolation trench to form the isolation layer 25. The active regions 24 are defined by the isolation layer 25. Although not illustrated, a buried gate process may be performed after the isolation layer 25 is formed. The BG is not illustrated in the cross-sectional views taken along the line A-A' and may be formed by any reasonably suitable method of forming a buried gate.

Figure 3B:
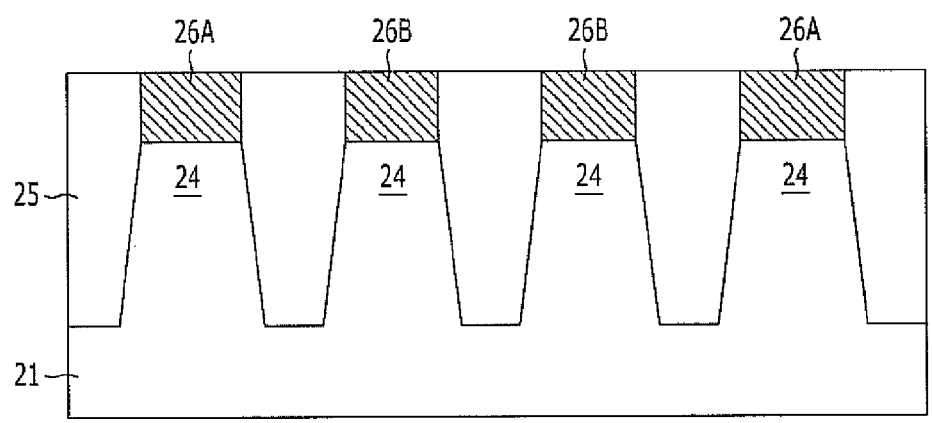

Referring to FIG. 3B, the pad oxide layer 22 and the pad nitride layer 23 are removed.

The first landing plugs 26A and the second landing plugs 26B are formed on portions of the surface of the active area 24 after removal of the pad oxide layer 22 and the pad nitride layer 23. The first landing plug 26A is coupled to a bit line, and the second landing plug 26B is coupled to a storage node contact plug. The first and second landing plugs 26A and 26B may be formed to be self-aligned with the isolation layer 25. The first and second landing plugs 26A and 26B may each include a polysilicon layer. For example, in order to form the first and second landing plugs 26A and 26B, a polysilicon layer is deposited, and an etchback or chemical mechanical polishing (CMP) process is then performed.

In accordance with another embodiment of the present invention, the first and second landing plugs 26A and 26B may be formed before the isolation layer 25 is formed. For example, a conductive layer to be used as the first and second landing plugs 26A and 26B is formed and then etched through an STI process to form the first and second landing plugs 26A and 26B. Using the first and second landing plugs 26A and 26B as an etch barrier, the semiconductor substrate 21 is etched to form trenches, and the isolation layer 25 is formed to fill the trenches.

Figure 3C:
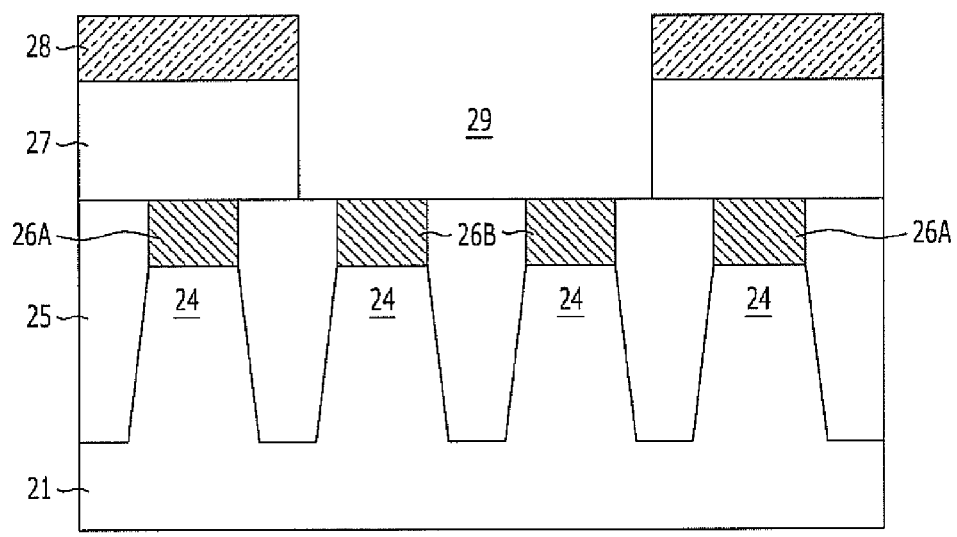

Referring to FIG. 3C, an interlayer dielectric layer 27 is formed on the entire surface of the resultant structure including the first and second landing plugs 26A and 26B. The interlayer dielectric layer 27 includes oxide such as boron phospho-silicate glass (BPSG) oxide or high density plasma (HDP) oxide.

A storage node contact mask 28 is formed on the interlayer dielectric layer 27 by using a photoresist layer.

The interlayer dielectric layer 27 is etched by using the storage node contact mask 28 as an etch barrier. Accordingly, a dual storage node contact hole 29 is formed to simultaneously open the second landing plugs 26B over the active regions 24 adjacent along the A-A' direction.

Figure 3D:
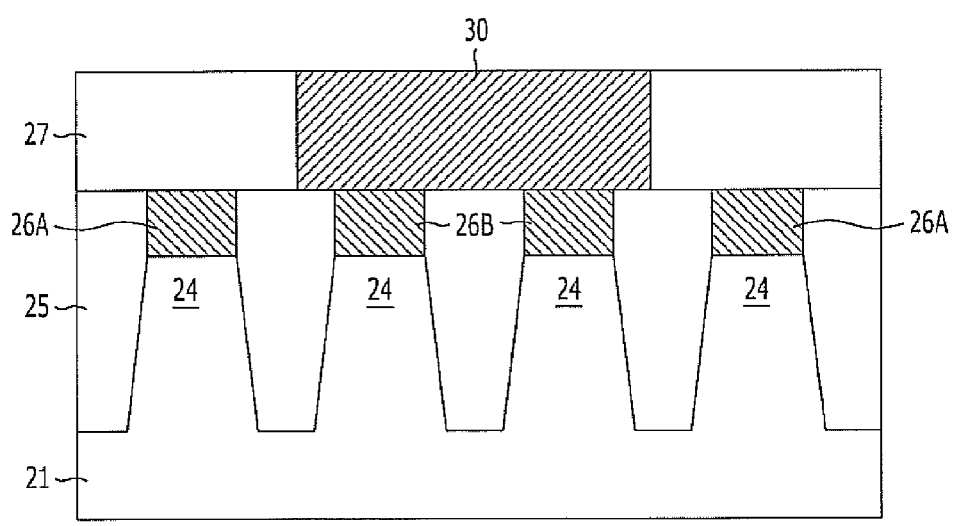

Referring to FIG. 3D, the storage node contact mask 28 is removed. A dual storage node contact plug 30 is formed to fill the dual storage node contact hole 29. In order to form the dual storage node contact plug 30, a polysilicon layer is deposited, and a CMP or etchback process is then performed.

Figure 3E:
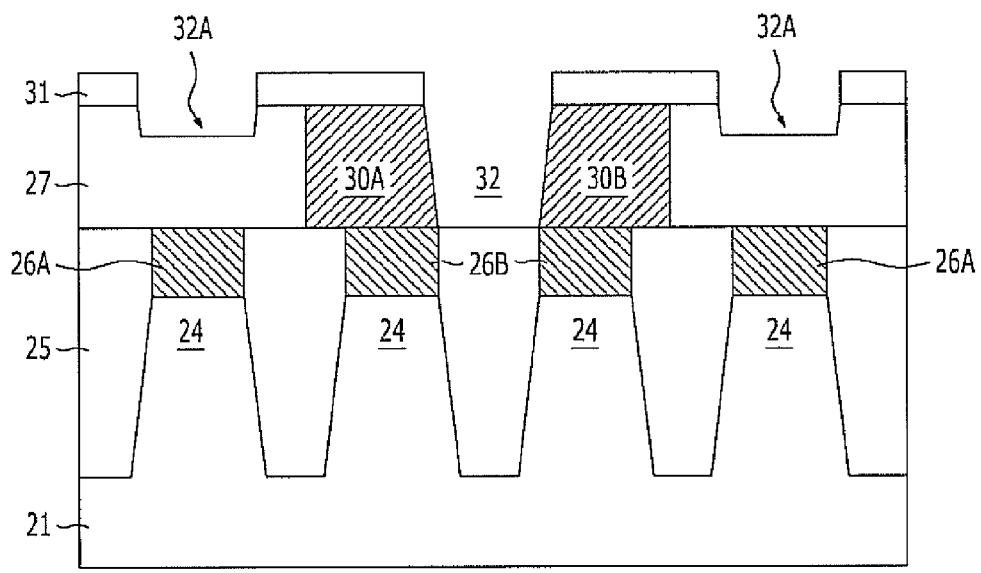

Referring to FIG. 3E, a damascene mask 31 is formed. The damascene mask 31 is an etch barrier for forming a damascene pattern which is to isolate the dual storage node contact plug 30 and in which a bit line is to be formed. That is, patterning is formed to simultaneously open the dual storage node contact plug 30 and the interlayer dielectric layer 27 in a line shape. The damascene mask 31 may be formed by using a photoresist layer or hard mask layer. When the hard mask layer is used, the hard mask layer is patterned by using a photoresist layer. The hard mask layer includes oxide or nitride.

The dual storage node contact plug 30 is etched by using the damascene mask 31 as an etch barrier. Accordingly, a first damascene pattern 32 is formed, and storage node contact plugs 30A and 30B which are independent of each other are formed by the first damascene pattern 32. In etching the dual node contact plug 30, since the storage node contact plugs 30A and 30B include a polysilicon layer, gas for selectively etching the polysilicon layer is used. The interlayer dielectric layer 27 exposed by the damascene mask 31 may be partially etched to form a groove 32A. The first damascene pattern 32 provides a space in which a bit line is to be formed. The process of forming the first damascene pattern 32 is referred to as a primary damascene process.

Figure 3F:
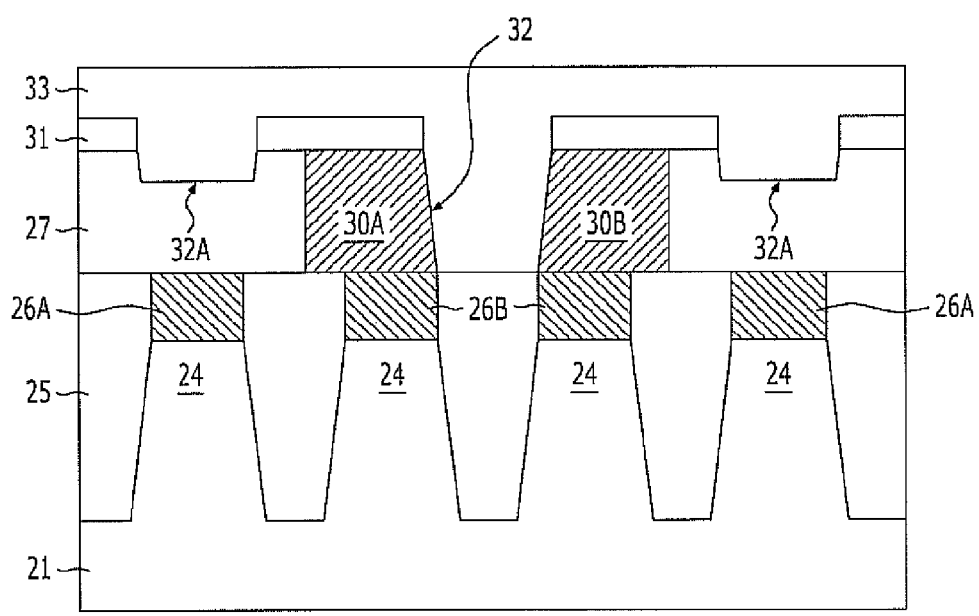

Referring to FIG. 3F, a protective layer 33 is formed to gap-fill the first damascene pattern 32. The groove 33 is also gap-filled with the protective layer 33. The protective layer 33 includes a carbon-containing material. The protective layer 33 may include carbon layer obtained by a spin on coating method (hereafter, referred to as 'spin on carbon'), and the spin on carbon may be formed to a thickness of 500 to 1,000 Å. As the spin on coating method is used, the first damascene pattern 32 may be gap-filled without a void. The protective layer 33 may be formed by using a photoresist layer instead of the spin on carbon.

Figure 3G:
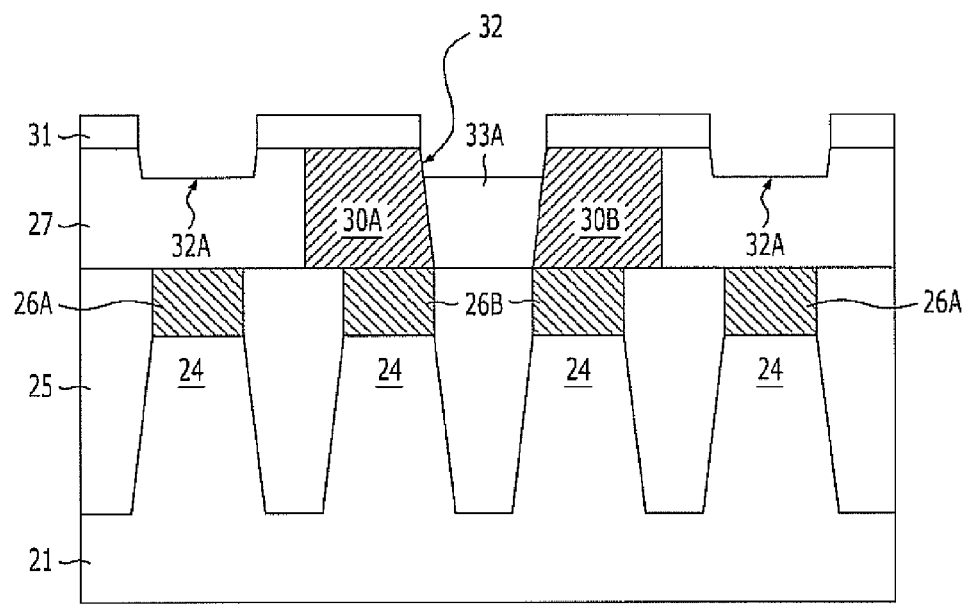

Referring to FIG. 3G, the protective layer 33 is blanket-etched. As the protective layer 33 is blanket-etched, a protective layer pattern 33A remains only inside the first damascene pattern 32. The protective layer is to be, for example, completely removed from the groove 32A. That is, the protective layer 33 is blanket-etched until the bottom of the groove 32A is exposed. The blanket etching of the protective layer 33 includes an etchback process. When the protective layer 33 includes spin-on carbon, oxygen-based plasma is used to perform the blanket etching.

Figure 3H:
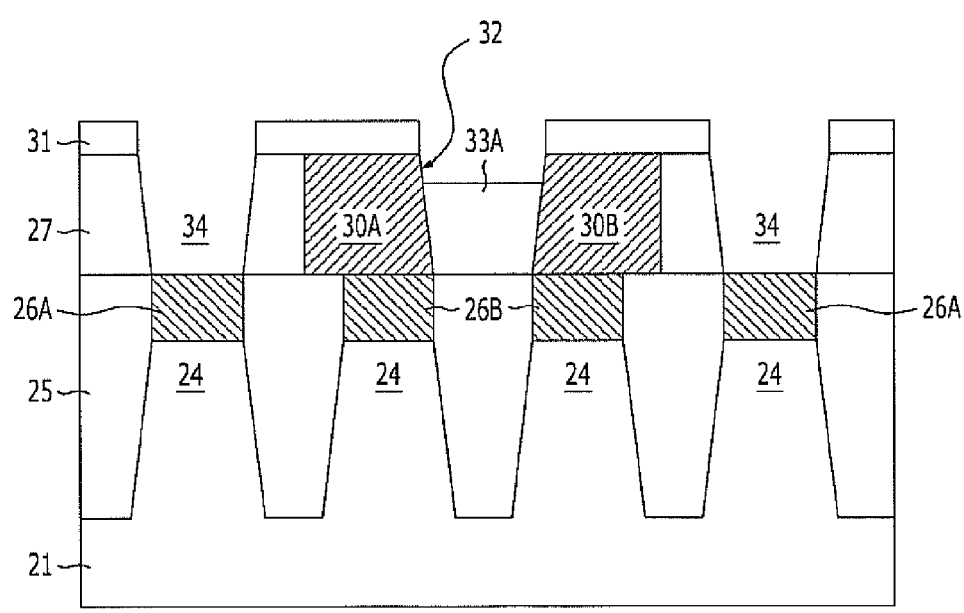

Referring to FIG. 3H, the interlayer dielectric layer 27 is etched by using the damascene mask 31 as an etch mask. Accordingly, second damascene patterns 34 are formed to provide spaces in which a bit line contact and a bit line are to be formed. The process of forming the second damascene pattern 34 is referred to as a secondary damascene process.

The surface of the first landing plug 26A is exposed by the second damascene patterns 34. When the second damascene patterns 34 are formed, the inside of the first damascene pattern 32 is protected by the protective layer pattern 33A. Therefore, the isolation layer 34 under the first damascene pattern 32 is prevented from being damaged.

The second damascene patterns 34 are coupled to the first damascene pattern 32 so as to form a line shape. Such damascene patterns provide spaces in which a bit line contact and a damascene bit line are to be formed.

In accordance with the above descriptions, the damascene process for forming a damascene bit line is performed in a state in which the damascene process is divided into the primary and secondary damascene processes. Furthermore, between the primary and secondary damascene processes, the process of forming the protective layer pattern 33A is performed. During the primary damascene process, the dual storage node contact plug 30 is etched. During the secondary damascene process, the interlayer dielectric layer 27 is etched.

As such, after the storage node contact plugs 30A and 30B are isolated, the protective layer pattern 33A is formed, and subsequently, the interlayer dielectric layer 27 is etched. Therefore, the storage node contact plugs 30A and 30B are easily isolated, and the loss of the isolation layer 25 is substantially prevented by the protective layer pattern 33A.

Furthermore, since only the interlayer dielectric layer 27 is etched when the second damascene pattern 34 is formed, the etching process may be sufficiently performed. Accordingly, an appropriate bottom profile of the second damascene pattern 34 may be obtained, and a sufficient bottom open CD may be secured.

Furthermore, since the etching of the dual storage node contact plug 30 is sufficiently performed, the storage node contact plugs 30A and 30B are sufficiently isolated.

Figure 3I:
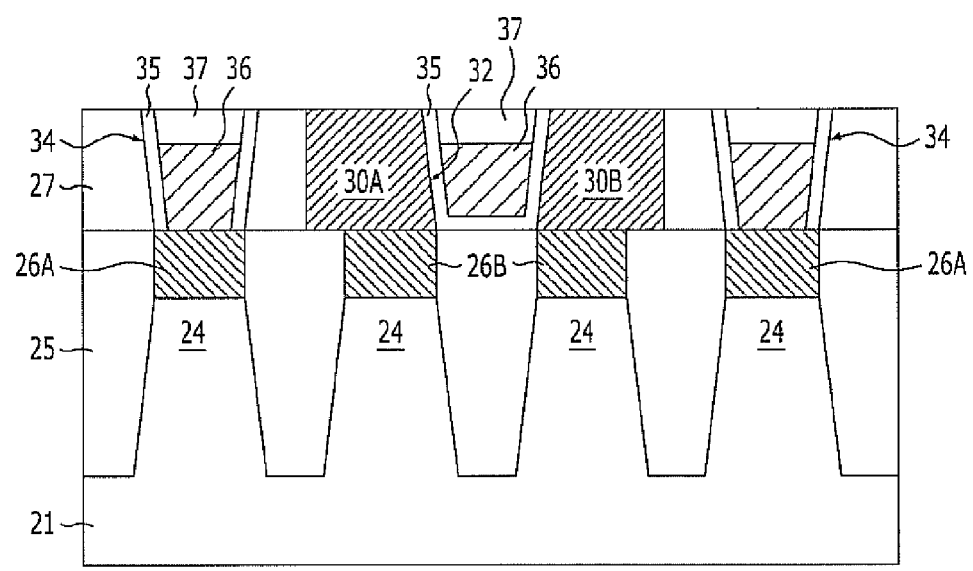

Referring to FIG. 3I, the damascene mask 31 is removed. At this time, when the damascene mask 31 includes a photoresist layer, the damascene mask 31 is stripped by using oxygen-based plasma. When the damascene mask 31 is removed, the protective layer pattern 33A formed of a carbon-containing material may be simultaneously removed. When the damascene mask 31 includes a hard mask layer, the protective layer 33A may be removed after the damascene mask 31 is removed. In accordance with another embodiment of the present invention, when the damascene mask 31 includes a hard mask layer, only the protective layer pattern 33A may be first removed, and the hard mask layer may be removed during a CMP process of a subsequent damascene bit line process.

A spacer layer is deposited, and spacer etching is performed. Accordingly, the spacer 35 is formed on the sidewalls of the first and second damascene patterns 32 and 34.

The spacer 35 is formed on sidewalls of the storage node contact plugs 30A and 30B as well as both sidewalls of the first and second damascene patterns 32 and 34. Meanwhile, the spacer 35 formed on the sidewalls of the first damascene pattern 32 may remain on the bottom surface of the first damascene pattern 32. Accordingly, the short circuit between the damascene bit line and the second landing plug 26B is substantially prevented. In order to cause the spacer 35 to remain on the bottom surface of the first damascene pattern 32, an additional mask is used. The additional mask is a bit line contact mask which is patterned to selectively expose only the first landing plug 26A under the second damascene pattern 34.

In accordance with another embodiment of the present invention, a dual spacer may be applied as the spacer 35. That is, a dual spacer including an oxide spacer and a nitride spacer is formed. As such, when the dual spacer is formed, a parasitic capacitance between the bit line and the storage node contact plug may be reduced.

A bit line interconnection layer is deposited, and a CMP process is performed. The bit line interconnection layer includes a titanium nitride layer or a tungsten layer. The bit line interconnection layer may be formed by stacking a tungsten layer on a titanium nitride layer deposited to a small thickness. The titanium nitride layer may serve as a diffusion barrier between the tungsten layer and the first landing plug 26A.

An etchback process is performed to recess the bit line interconnection layer. Accordingly, damascene bit lines 36 are formed in such a shape as to partially fill the first and second damascene patterns 32 and 34.

A capping layer 37 is formed to gap-fill the space over the damascene bit line 36. The capping layer 37 includes an insulation layer having an excellent gap-fill property. For example, the capping layer 37 includes oxide or nitride. A CMP process is performed to planarize the resultant structure.

In accordance with the embodiment of the present invention, since the interlayer dielectric layer is sufficiently etched, an appropriate bottom profile of the damascene pattern contacted with the damascene bit line may be obtained, and the bottom open CD of the damascene pattern may be expanded to improve bit line contact resistance.

Furthermore, since the interlayer dielectric layer is etched after the dual storage node contact plug is etched, the loss of the landing plug under the damascene pattern may be reduced.

Accordingly, appropriate reliability of the semiconductor device and the yield of the fabrication process may be obtained.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an interlayer dielectric layer over a substrate;
    forming a dual storage node contact plug to be buried in the interlayer dielectric layer;
    forming a first damascene pattern to isolate the dual storage node contact plug;
    forming a protective layer pattern inside the first damascene pattern;
    etching the interlayer dielectric layer to form a second damascene pattern to be coupled to the first damascene pattern; and
    forming bit lines inside the first and second damascene patterns.

2. The method of claim 1, wherein the forming of the protective layer pattern comprises:
    forming a protective layer over the entire surface of the resultant substrate structure formed after the forming of the first damascene pattern so as to gap-fill the first damascene pattern; and
    blanket-etching the protective layer.

3. The method of claim 2, wherein the protective layer comprises a carbon layer.

4. The method of claim 3, wherein the carbon layer comprises spin on carbon layer.

5. The method of claim 4, wherein, in the blank-etching of the protective layer, oxygen-based plasma is used.

6. The method of claim 2, wherein the protective layer comprises a photoresist layer.

7. The method of claim 1, further comprising forming a spacer on sidewalls of the first and second damascene patterns, before the forming of the bit lines.

8. The method of claim 1, wherein the dual storage node contact plug comprises a polysilicon layer and the interlayer dielectric layer comprises an oxide layer.

9. The method of claim 1, wherein, in the forming of the first damascene pattern and the second damascene pattern, a damascene mask which simultaneously opens the dual storage node contact plug and the interlayer dielectric layer in a line shape is used as an etch barrier.

10. The method of claim 1, wherein the forming of the protective layer pattern inside the first damascene pattern is performed before the etching of the interlayer dielectric layer to form the second damascene pattern.

11. The method of claim 1, further comprising forming of a spacer and etching the spacer inside the first and second damascene patterns before the forming of the bit lines, wherein the spacer remains at the bottom of the first damascene pattern after the spacer etching and does not remain at the bottom of the second damascene pattern after the spacer etching.

12. A method for fabricating a semiconductor device, comprising:
    forming a plurality of active regions in a substrate, the active regions being isolated by an isolation layer;
    forming an interlayer dielectric layer over the substrate;
    etching the interlayer dielectric layer to form a dual storage node contact hole which simultaneously opens adjacent ones of the active regions;
    forming a dual storage node contact plug to be buried in the dual storage node contact hole;
    forming a first damascene pattern to isolate the dual storage node contact plug into independent storage node contact plugs;
    forming a protective layer pattern inside the first damascene pattern;
    etching the interlayer dielectric layer to form a second damascene pattern to be coupled to the first damascene pattern; and
    forming bit lines inside the first and second damascene patterns.

13. The method of claim 12, further comprising forming trenches by etching the active regions and the isolation layer and forming buried gates to partially fill the trenches before the forming of the interlayer dielectric layer.

14. The method of claim 12, further comprising forming a first landing plug and a second landing plug over the substrate before the forming of the interlayer dielectric layer, wherein the first landing plug is coupled to the bit line and the second landing plug is coupled to the storage node contact plug.

15. The method of claim 12, wherein the forming of the protective layer pattern comprises:
    forming a protective layer over the entire surface of the resultant substrate structure formed by the forming of the first damascene pattern so as to gap-fill the first damascene pattern; and
    blanket-etching the protective layer.

16. The method of claim 15, wherein the protective layer comprises spin on carbon layer or a photoresist layer.

17. The method of claim 15, wherein, in the blank-etching of the protective layer, oxygen-based plasma is used.

18. The method of claim 12, further comprising forming a spacer on sidewalls of the first and second damascene patterns, before the forming of the bit lines.

19. The method of claim 12, wherein the dual storage node contact plug comprises a polysilicon layer and the interlayer dielectric layer comprises an oxide layer.

20. The method of claim 12, wherein, in the forming of the first damascene pattern and the second damascene pattern, a damascene mask which simultaneously opens the dual storage node contact plug and the interlayer dielectric layer in a line shape is used as an etch barrier.

* * * * *